United States Patent
Huang et al.

(10) Patent No.: US 6,531,407 B1
(45) Date of Patent: Mar. 11, 2003

(54) METHOD, STRUCTURE AND PROCESS FLOW TO REDUCE LINE-LINE CAPACITANCE WITH LOW-K MATERIAL

(75) Inventors: Ying Huang, Meridian, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 09/653,153

(22) Filed: Aug. 31, 2000

(51) Int. Cl.$^7$ .............................................. H01L 21/31
(52) U.S. Cl. ...................................... 438/758; 438/778
(58) Field of Search ................................ 438/758, 787, 438/211, 216, 219, 221, 240, 257, 287, 288, 295, 296, 359, 400, 404, 622, 624, 634, 778

(56) References Cited

U.S. PATENT DOCUMENTS

| | | | |
|---|---|---|---|
| 5,122,483 A | * 6/1992 | Sakai et al. | .................. 437/238 |
| 5,946,601 A | 8/1999 | Wong et al. | |
| 6,033,979 A | 3/2000 | Endo | |
| 6,037,664 A | 3/2000 | Zhao et al. | |
| 6,046,104 A | 4/2000 | Kepler | |
| 6,057,417 A | 5/2000 | Arnold et al. | |
| 6,265,779 B1 | * 7/2001 | Grill et al. | .................. 257/759 |
| 6,284,657 B1 | * 9/2001 | Chooi et al. | ................. 438/687 |
| 6,410,437 B1 | * 6/2002 | Flanner et al. | ............... 438/689 |

OTHER PUBLICATIONS

Baliga, John, "Options for CVD of Dielectrics Include Low–k Materials," Semiconductor International Jun. 1998, pp. 1–6.
Singer, Peter, "Dual–Damascene Challenges Dielectrics–Etch," Semiconductor International Aug. 1999, pp. 1–5.

* cited by examiner

Primary Examiner—Kamand Cuneo
Assistant Examiner—Scott B Geyer
(74) Attorney, Agent, or Firm—Wells St. John P.S.

(57) ABSTRACT

An improved method, structure and process flow for reducing line-line capacitance using low dielectric constant (K) materials is provided. Embodiments in accordance with the present invention form structures for semiconductor devices having a single level of interconnection as well as semiconductor devices having multiple levels of interconnection. In embodiments of the present invention, an initial dielectric structure is formed having a first low-K material overlaid with a standard-K material. In subsequent processing, conductive interconnects are formed and the standard-K material replaced with a second low-K material. In some embodiments of the present invention, the first and-second low-K materials are the same material, in some embodiments the first and second low-K materials are different materials. Embodiments of the present invention having multiple levels of conductive interconnects are formed by employing methods and materials analogous to those used to form the first level of conductive interconnect and dielectric material disposed there between. Embodiments of the present invention employ low-K materials formed by spin-on processes as well as low-K materials formed by CVD processes.

26 Claims, 5 Drawing Sheets

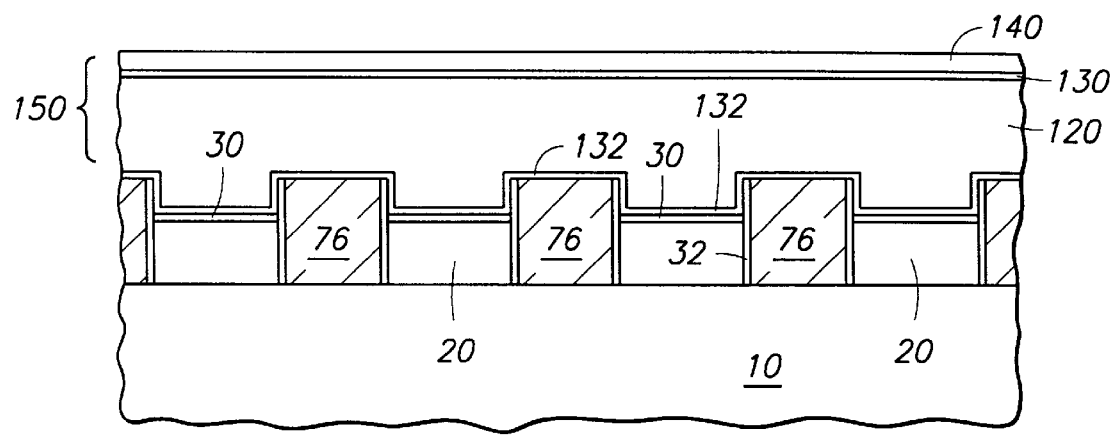
F I G 7
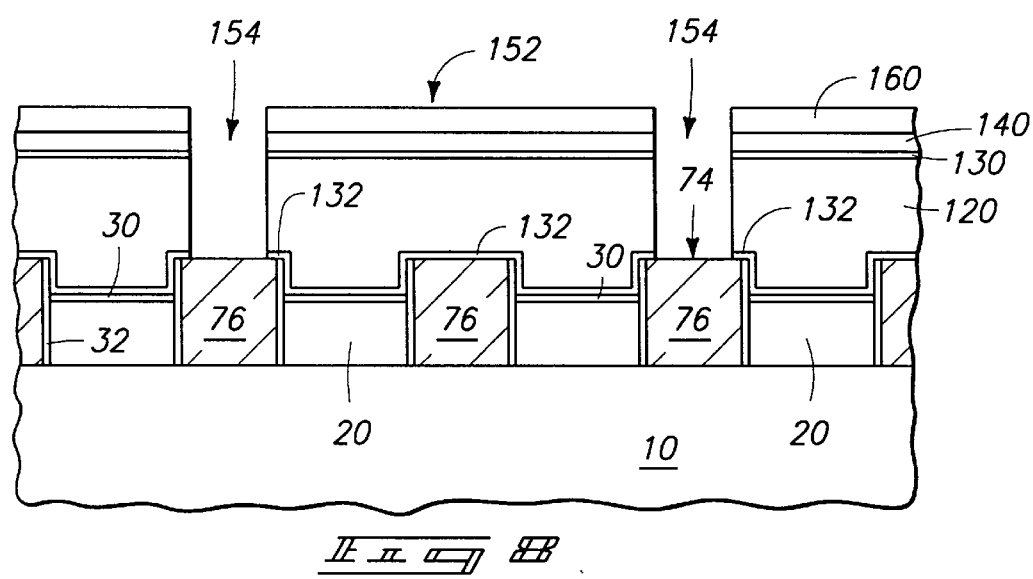
F I G 8
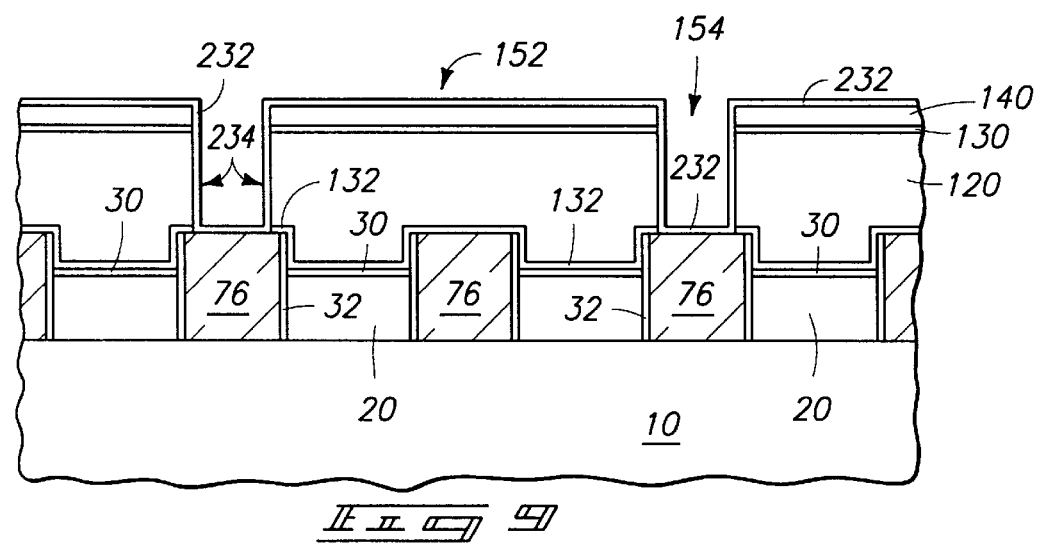
F I G 9

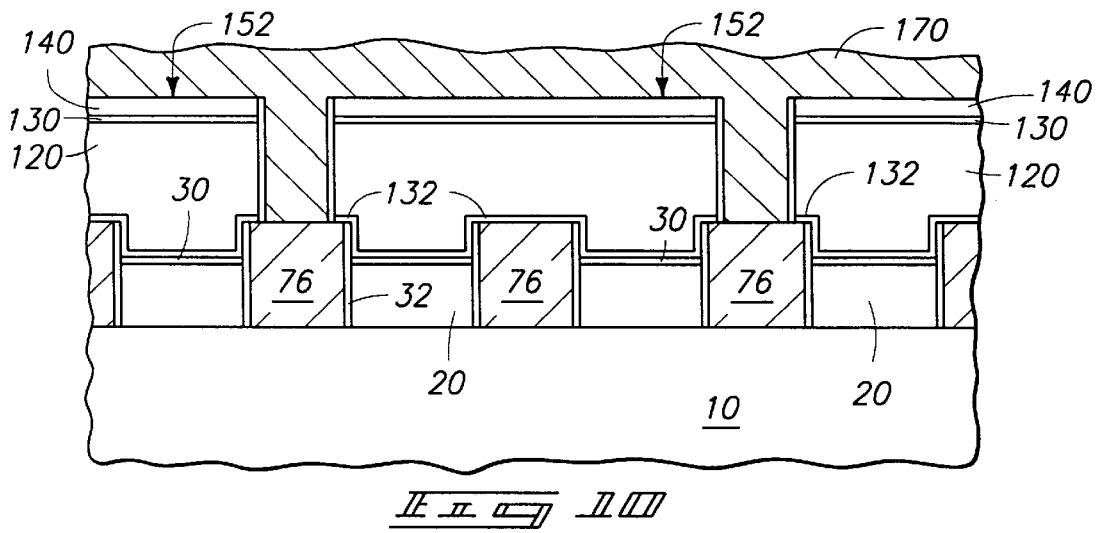
_Fig. 10_
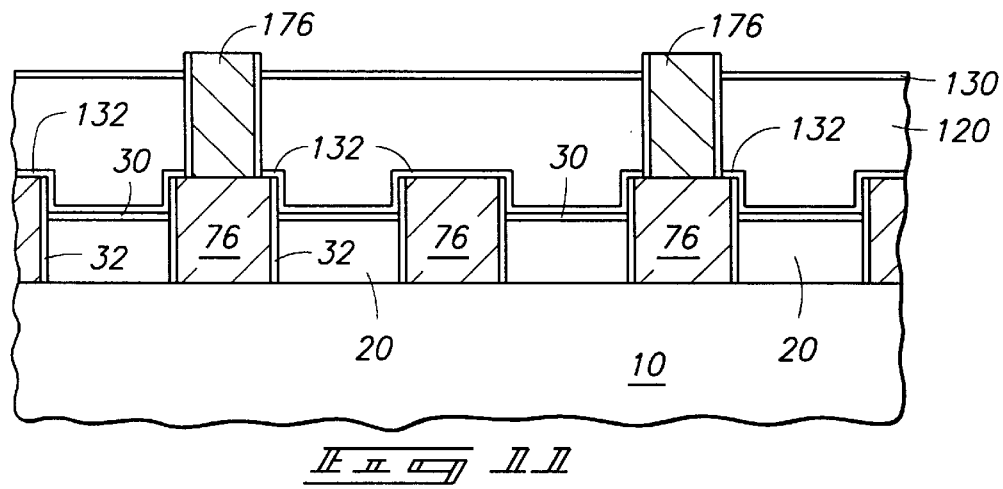
_Fig. 11_
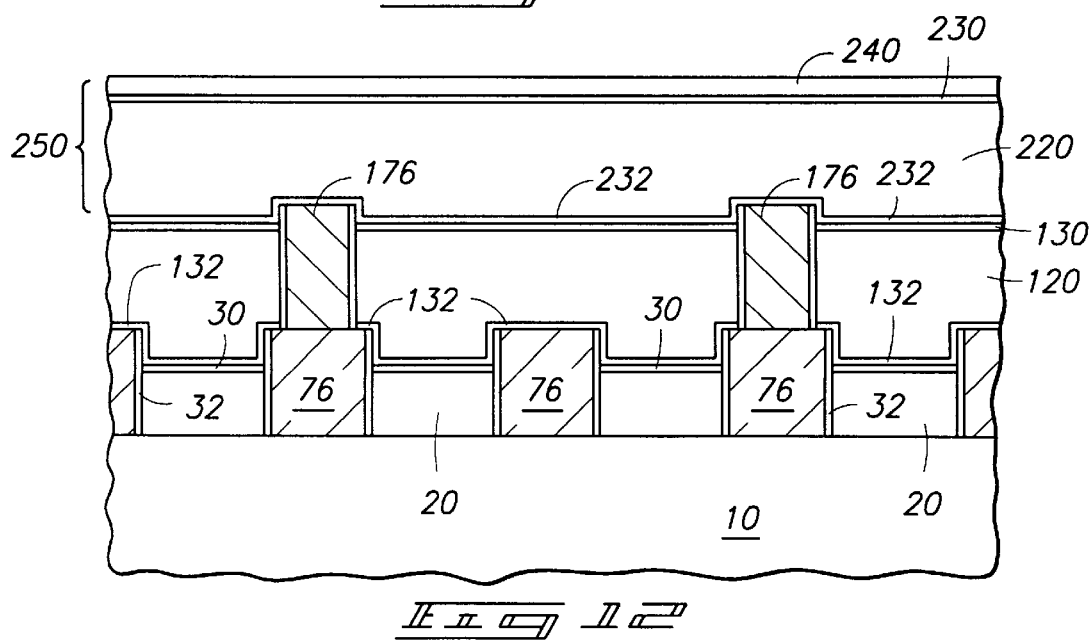
_Fig. 12_

METHOD, STRUCTURE AND PROCESS FLOW TO REDUCE LINE-LINE CAPACITANCE WITH LOW-K MATERIAL

TECHNICAL FIELD

The present invention relates to an improved method and process flow for integrated circuit manufacture and more particularly, to a method and process flow for reducing line to line capacitance in integrated circuit devices by using low dielectric constant materials.

BACKGROUND OF THE INVENTION

As advances in processing technology allow for an increasing number of devices to be fabricated on a single integrated circuit (IC), the surface area or size of each individual device on the IC is scaled down or reduced. Conductive lines or interconnects that electrically couple such individual devices, are also scaled. However, the same scaling factor applied to line width and line to line spacing is not generally applied to interconnect a line thickness due to the need to maintain minimum current carrying capacity. Thus, interconnect lines are often thicker than that which the scaling factor employed for the line width would predict.

Adjacent interconnect lines form a capacitor where the plate area of each plate of the capacitor formed is the product of the length of the line and its thickness, over that length. The capacitance of such a capacitor is directly proportional to area of the capacitor plates and the dielectric constant of the dielectric material disposed between the plates, and inversely proportional to the distance between the capacitor plates (line-line spacing). Thus, as IC's are scaled down in size the line to line spacing decrease and the increased number of lines that are needed to interconnect the increased number of devices, results in an increase in the line to line capacitance. In addition to this line to line capacitance, the capacitance between interconnects of adjacent levels, often referred to as cross-talk, is also a factor in an IC's total interconnect capacitance. In some high speed circuits, this interconnect capacitance can be the limiting factor in the speed at which the IC can function. Thus it would be desirable to be able to reduce this total interconnect capacitance.

A significant factor in the value of interconnect capacitance is the dielectric constant of the materials that surround interconnect lines, as capacitance is directly proportional to such material's dielectric constant. For example, where silicon nitride, with a dielectric constant of about 7.0, is used as such a material, the resulting capacitance is higher than if silicon dioxide, with a dielectric constant of about 3.9, were employed. However, as silicon oxide is currently the most commonly used material, reduced interconnect capacitance is dependent on new, lower dielectric constant materials. However, it has been found that use of such low dielectric constant (low-K) materials is often problematic.

Thus it would be advantageous to provide improved methods for fabricating advanced IC's that reduce or eliminate this increase in interconnect capacitance as IC's are scaled down in size. It would be desirable if these improved methods provided for forming interconnect lines with low line to line capacitance within a layer of interconnect lines. In addition, it would be desirable if the methods also served to reduce cross-talk between interconnect lines of adjacent layers of such lines. It would also be desirable if this processing method and flow was readily integratable into a standard semiconductor process flow, thus avoiding increased costs and yield losses due to increased process complexity. In this manner, smaller, faster, more complex, and more densely packed integrated circuits such as DRAMs and the like are provided.

SUMMARY

Methods for forming an integrated circuit having an interconnect structure that employs low dielectric constant materials are provided. Such methods provide for a lower total interconnect capacitance than methods that employ standard dielectric materials with dielectric constants equal to or greater than that of silicon dioxide.

In some embodiments in accordance with the present invention, dielectric regions are formed that encompass a low dielectric constant material and another dielectric material having a higher dielectric constant. Such regions are employed to define regions where interconnects are to be formed. In some embodiments of the present invention, such low dielectric constant interconnect structures are formed for a single interconnect layer, while in other embodiments, such low dielectric constant interconnect structures are formed for multiple interconnect layers within the integrated circuit. In some embodiments of the present invention, the dielectric regions are converted into low dielectric constant regions, also referred to as low-K regions, where one or more low dielectric constant materials are employed for forming the low-K region structure, the one or more low dielectric constant materials having different insulative properties.

Some embodiments in accordance with the present invention employ a copper or copper alloy metallization for such Interconnects while other embodiments employ aluminum or an aluminum alloy metallization for such interconnects. In some embodiments, the low dielectric material is formed using a liquid precursor material in a spin-on coating process, while in other embodiments, a chemical vapor deposition (CVD) process is employed to form the low dielectric constant material. In some embodiments of the present invention, a barrier layer is formed overlying a layer of low dielectric constant material prior to forming another layer of dielectric material. In other embodiments, such a barrier layer is not employed. Where a barrier layer is formed, some such layer can also serve as an etch-stop layer for etching another dielectric constant material from the low dielectric constant material.

Some embodiments in accordance with the present invention employ at least one refractory metal nitride barrier layer to isolate the interconnect lines from the dielectric material. In some embodiments such a refractory metal barrier layer is conductive, in other embodiments it is not conductive.

In some embodiments of the present invention, multiple levels of interconnects are formed having multiple low-K region structures formed of one or more low-K materials, where the one or more materials can have different insulative properties. In some multiple level embodiments in accordance with the present invention, a single type of low-K material is employed for each low-K region, while in some embodiments more that one low-K material and or standard dielectric constant material is employed to form a dielectric region having a dielectric constant less than that which would be obtained if only such standard materials are employed.

BRIEF DESCRIPTION OF THE DRAWINGS

Embodiments of the invention are described below with reference to the following accompanying drawings. For ease of understanding and simplicity, common numbering of elements within the drawings is employed where the element is the same between drawings.

FIGS. 1–14 are cross-sectional views of a portion of an integrated circuit at various stages of a processing method in accordance with embodiments of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Embodiments of the present invention will be described with reference to the aforementioned figures. Various modifications or adaptations of specific methods and or structures may become apparent to those skilled in the art as embodiments of the present invention are described. All such modifications, adaptations or variations that rely upon the teachings of the present invention, and through which these teachings have advanced the art, are considered to be within the spirit and scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. In addition, the terms "low dielectric constant material" or "low-K material" are used interchangeably herein and refer to materials having a dielectric constant that is lower than that of thermally grown silicon dioxide, or a value of approximately 3.7 or lower, and the term "standard dielectric material" refers to a material having a dielectric constant between that of silicon dioxide and silicon nitride or greater than about 3.7 to 7.0 or higher.

Figure 1:
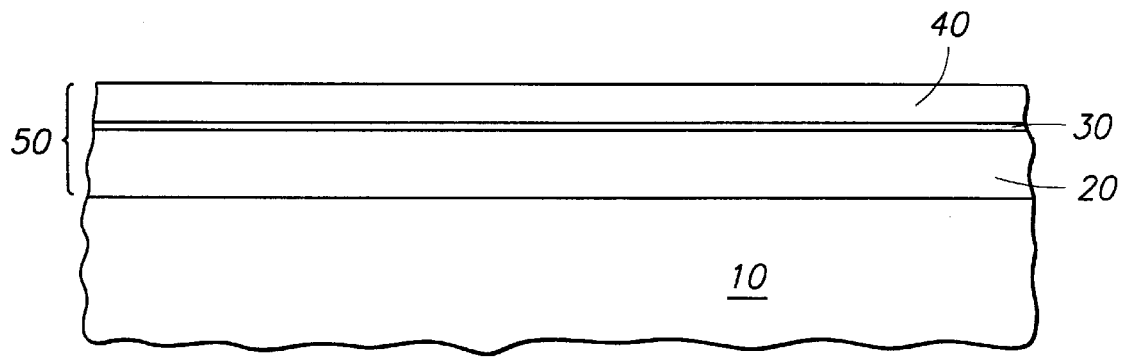

Referring to FIG. 1, a portion of an integrated circuit at an early stage of fabrication in accordance with some embodiments of the present invention is depicted. A first dielectric stack 50 is shown encompassing a layer of a first material 20 disposed over semiconductor substrate 10. First material 20 encompasses a material having as a characteristic, a low dielectric constant. Such a material is referred to herein as a low-K material, which, as mentioned above, is defined as a material having a dielectric constant that is lower than that of thermally grown silicon dioxide, or a value of approximately 3.7 or less. Advantageously, a variety of such low-K materials are known, and layer 20 can encompass, any of such materials, for example, cured hydrogen or methyl silsesquioxane compositions. Other exemplary materials include, but are not limited to, the various PolyArylene Ether (PAE) polymers such as SiLK® manufactured by The Dow Chemical Company of Midland, Mich., Velox™ manufactured by Schumacher of Carlsbad, Calif., or FLARE™ manufactured by Honeywell of Morristown, N.J. Each of the exemplary materials is generally available as a liquid precursor material which is applied to substrate 10 by a spin-coating process and subsequently cured into a solid dielectric material. Generally, a thickness in the range of approximately 100 nanometers (nm) to approximately 1000 nm for first layer 20 is appropriate for most low-K materials, where a thickness of approximately 400 nm to 800 nm is typical for the range of materials mentioned above.

Additionally, in some embodiments in accordance with the present invention, first low-K layer 20 can be formed using chemical vapor deposition (CVI)) methods and materials, for example fluorine or carbon-comprising silicon oxides. Such CVD methods will employ processing steps different than those employed where the low-K material is formed from a spin-on material precursor, however a range of thickness between approximately 100 nanometers (rm) to approximately 1000 nm for such a low-K CVD formed layer is still generally appropriate. It will be understood then, that any and all of the specific process steps for the forming of low-K layer 20 from a spin-on type of material or a CVD type of material, as well as the materials themselves are design choices and that this range of materials and processing choices is within the scope and spirit of the present invention.

Still referring to FIG. 1, first dielectric stack 50 is shown further encompassing a first etch-stop or protective-barrier layer 30 overlying low-K layer 20. In some embodiments in. accordance with the present invention, it is advantageous to employ first protective-barrier layer 30 to prevent outgassing from low-K layer 20 during the subsequent formation of a first standard dielectric constant (K) layer 40. First standard-K layer 40 is depicted in FIG. 1 as being encompassed by dielectric stack 50. In some embodiments, first barrier layer 30 serves primarily in a subsequent process as an etch-stop in addition to or instead of serving as a protective-barrier to prevent the aforementioned outgassing. Advantageously, where barrier layer 30 encompasses one of the common dielectric materials such as silicon nitride, silicon oxynitride or silicon carbide, such layer is formed with a thickness in the range of about 3 nm to about 15 nm, although other thicknesses for first barrier layer 30 can be utilized where appropriate, as can other appropriate materials. In some embodiments, barrier layer 30 can be omitted. However, where such layer is present, it will be understood, that the thickness for first barrier layer 30 is dependent on, among other things, the specific material and forming process used for low-K layer 20 as well as the material selected for barrier layer 30. Thus for a first barrier layer 30 encompassing silicon nitride and where first layer 20 is cured hydrogen silsesquioxane (HSQ), a thickness for layer 30 of approximately 3 nm to 8 nm is appropriate and a thickness of approximately 5 nm is typical.

As previously mentioned, FIG. 1 depicts first standard-K layer 40 overlying first low-K layer 20 and first barrier layer 30. Typically, standard-K layer 40 is one of the commonly used, CVD formed, dielectrics such as a silicon oxide material and is selected to be etchable selectively with respect to the material of first layer 30, if present, or with respect to the material of first layer 20 if barrier layer 30 is not present. As will be discussed below, typically first standard-K layer 40 is a sacrificial layer, that is to say a layer that will be removed at a subsequent processing step. Generally, first sacrificial layer 40 has a thickness in the range of approximately 100 nm to approximately 1000 nm. A total thickness of stack 50 (layers 20 and 40, as well as layer 30 if present), is generally no more than about 1000 nm although some embodiments in accordance with the present invention can employ a total thickness greater than 1000 nm. The specific thickness employed for layer 40, and the total thickness of stack 50 is dependent on the specific materials employed for each of the materials encompassed by stack 50 as well as the desired thickness of the dielectric stack.

Figure 2:
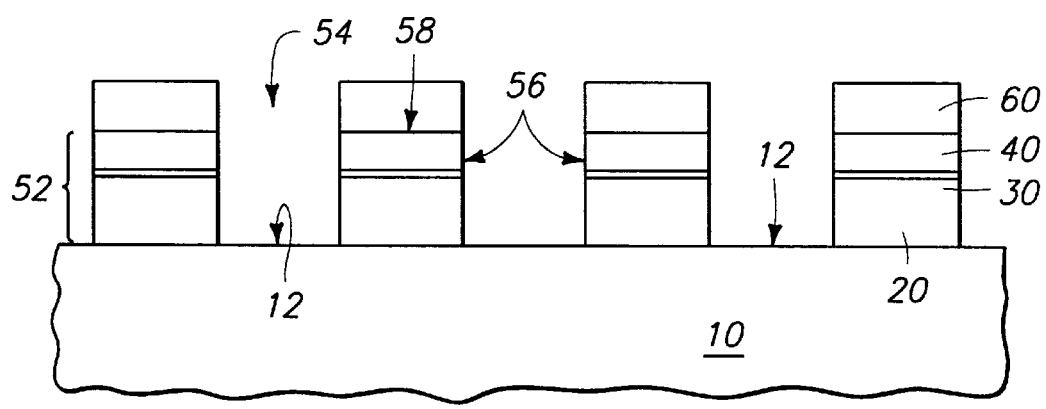

Turning now to FIG. 2, the structure of FIG. 1 is depicted after a first masking layer 60 is deposited, patterned and dielectric stack 50 (FIG. 1) etched to form first dielectric blocks 52 which define first open regions 54 over underlying substrate 10. While first masking layer 60 typically encompasses photoresist, other appropriate masking materials can be employed. The removing of portions of dielectric stack 50 is typically accomplished using a conventional plasma etch technique, although other methods for removing portions of stack 50 can be employed where appropriate. It will be understood that the specific processing used for removing such portions is tailored to optimize the removal of each of the specific materials within stack 50. Such an etching process then exposes an upper surface 12 of substrate 10 within each first open region 54, as well as first sidewalls 56 and first upper surfaces 58 of first dielectric blocks 52.

Figure 3:
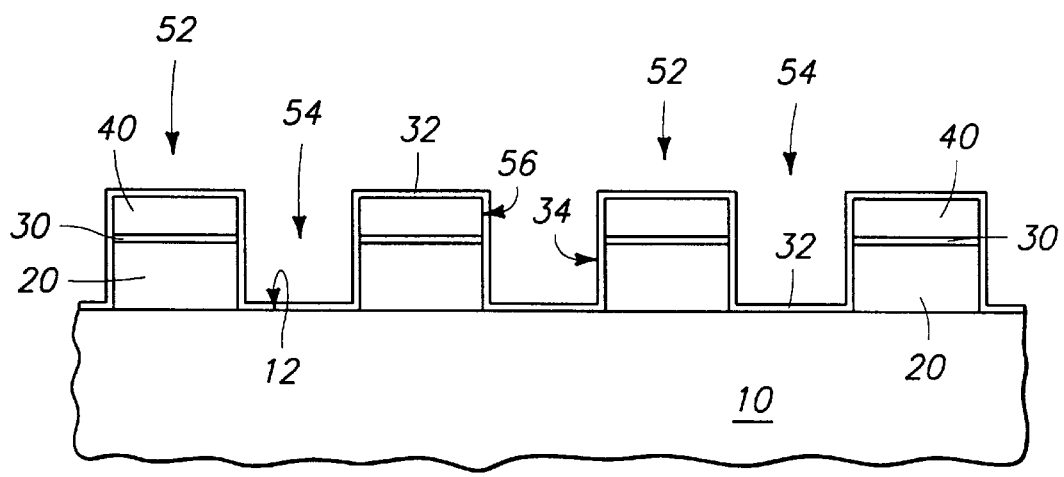

In FIG. 3, a first conformal barrier layer 32 is shown formed overlying substrate 10 after masking layer 60 (FIG. 2) is removed. Such first conformal layer 32 overlies upper surface 12 as well as sidewalls 56 and upper surfaces 58. Conformal barrier layer 32 is generally formed from any of the materials previously mentioned with regard to barrier layer 30, and serves to protect, or form a barrier, against interaction between the materials of dielectric stacks or regions 52 and a subsequently formed conductive layer within open regions 54. Thus rather than first sidewalls 56 being adjacent first open regions 54, conformal barrier layer 32 is disposed therebetween such that an outer surface 34 of layer 32 will be adjacent the subsequently formed conductive layer.

Figure 4:
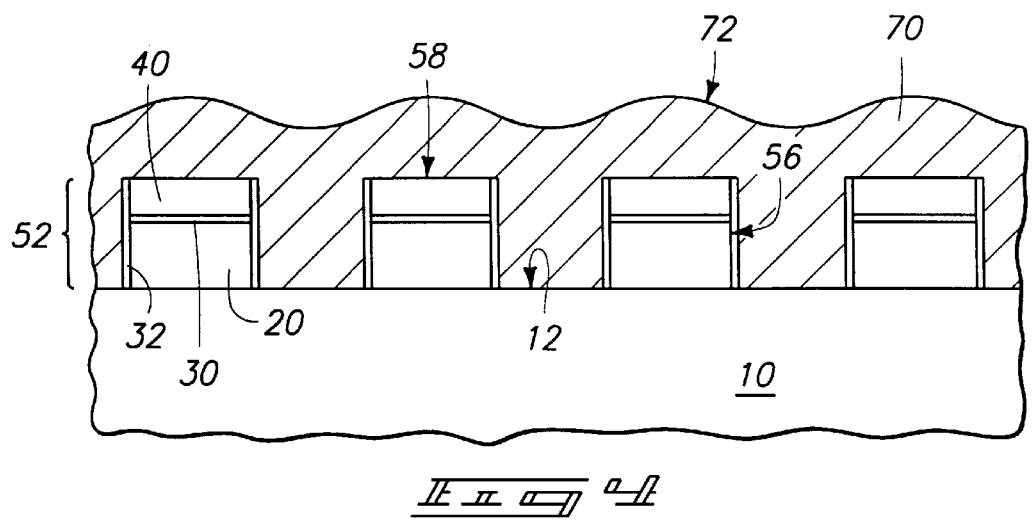

As seen in FIG. 4, first conformal barrier 32 is etched from over surface 12 as well as upper surface 58 prior to forming a first conductive layer 70. In this manner, where electrical contact between such conductive layer 70 and a contact region (not shown) in substrate 10 adjacent surface 12 is desired, any non-conductive material as might be encompassed by first conformal layer 32 is removed and electrical contact to such a contact region facilitated. As depicted, such etching leaves conformal barrier layer 32 disposed between first conductive layer 70 and first dielectric blocks 52, thus serving to form a barrier between the material of conductive layer 70 and the materials of dielectric blocks 52. In this manner, embodiments of the present invention serve to prevent the material of conductive layer 70 from interacting with the materials of blocks 52, or visa versa, during subsequent processing or, upon completion of the semiconductor processing operation, whilst the semiconductor device is in operation.

For example, where first conductive layer 70 is copper or a copper alloy, and any one of first layers 20, 30 or 40 encompass silicon oxide, copper migration into such silicon oxide layers is known to occur during subsequent processing or over time while the integrated circuit employing such structures is operating. Use of such a barrier is also known to be advantageous where conductive layer 70 is aluminum or an aluminum alloy and any of the materials of dielectric region 52 encompass fluorine. The material of first conformal layer 32 is selected to prevent such fluorine from reaching the aluminum or to prevent the copper migrating into silicon oxide. In addition, regardless of the material selected for first conductive layer 70, use of first conformal barrier layer 32 is advantageous for stabilizing the structure of FIG. 4 during a chemical mechanical polishing (CMP) step as is often employed for planarization purposes.

Referring again to FIG. 3, materials such as silicon nitride, silicon oxynitrides and silicon carbide, discussed with regard to first barrier layer 30, are generally used as non-conductive materials for conformal layer 32. More recently, materials such as nitrogen and hydrogen-comprising amorphous carbon and silicon and nitrogen-comprising amorphous carbon have become available and are also suitable for first conformal barrier layer 32. In addition, films of some refractory metal nitrides such as titanium nitride and tantalum nitride are conductive barrier materials that can be advantageously employed when no material of dielectric blocks 52 include fluorine and or when contact to a region within substrate 10 is desirable. The formation of first conformal layer 32 is accomplished by any method appropriate to the specific material selected, where such a method results in the forming an essentially conformal layer, as depicted. For example, where silicon nitride is selected for conformal barrier 32, a low pressure CVD process is generally advantageously employed. In addition, in a manner essentially analogous to that for barrier layer 30, the thickness for conformal barrier 32 will be a function of the specific material from which the barrier is formed, as well as the materials of dielectric region 52 and conductive layer 70 (FIG. 4). It will be noted that conformal barrier 32 initially overlies upper surfaces 12 of substrate 10 as well as sidewalls 56 and upper surfaces 58 of dielectric blocks 52.

As previously mentioned in some embodiments in accordance with the present invention, it is advantageous for conductive layer 70 to electrically contact doped regions (not shown) of substrate 10 at selected portions of surface 12 that provide access to such doped regions. Where a non-conductive material such as silicon nitride is selected for first conformal barrier layer 32, such embodiments generally require removal of such layer from surface 12, as depicted in FIG. 4. Advantageously, such a process for removal of conformal layer 32 from surface 12 is analogous to well known spacer forming processes and in some embodiments of the present invention, such an analogous process is employed. Alternatively, it can be advantageous to employ a conductive barrier material for first conformal layer 32, for example, a refractory metal nitride material. In this manner, such a material's conductivity eliminates the need for removing the material from surface 12. Advantageously, as will be seen in FIG. 5, in embodiments in accordance with the present invention, when first conductive layer 70 is planarized, such conductive second barrier material is removed from surface 42 and an electrical short circuit is avoided.

Figure 5:
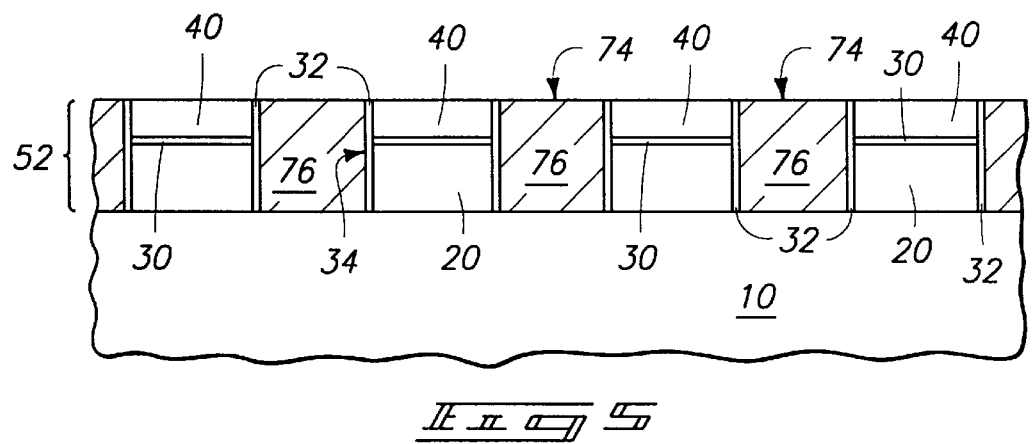

First conductive layer 70 generally encompasses a metal such as copper, aluminum, an alloy of copper or aluminum or some combination thereof, although other appropriate materials can be employed. As depicted in FIG. 4, layer 70 is formed to completely fill first open regions 54 (FIG. 3) and to overlie first dielectric blocks 52. Generally, where the material of layer 70 is a metal, the formation of such layer employs a physical vapor deposition (PVD) process such as a sputtering or evaporative process, although a CVD process, if known, can also be advantageously employed. As depicted, after forming conductive layer 70, a first upper surface 72 of such layer is generally irregular. Thus typically a planarization process is employed to form conductive interconnects 76 having a first planarized upper surface 74, as depicted in FIG. 5. It will be noted that as layer 70 is formed to completely fill open regions 54, the thickness of layer 70, as deposited, is necessarily greater than the thickness of dielectric blocks 52.

Turning now to FIG. 5, in some embodiments in accordance with the present invention, the formation of planarized surface 74 advantageously provides for the removal of portions of barrier layer 32 formed overlying dielectric blocks 52. Such embodiments generally employ a chemical mechanical polishing (CMP) process. In this manner, portions of first sacrificial layer 40 within such regions are exposed after planarization to facilitate the subsequent removal of such layer. It will be noted that while planarized surface 74 is generally formed using a CMP process, other appropriate planarization methods can also be employed. Finally, it will be noted that where a CMP planarization process is employed, first dielectric blocks 52 can serve as a planarization stop, thus the planarization process results in interconnect portions 76 having a thickness essentially equal to the thickness of the as formed first blocks 52. The specific thickness of first dielectric blocks 52 that is desired is actually a function, among other things, of the current carrying requirement for first interconnects 76. For example, where interconnects 76 are aluminum-comprising portions of a high performance memory integrated circuit that has a interconnect line width of approximately 0.25 micron, a thickness of 800 nm for interconnect 76 is found appropriate. Hence dielectric blocks 52 would also have a thickness of 800 mn. As known, other thickness for interconnects 76 for such an integrated circuit are also appropriate where metal composition and interconnect line width vary from the above example. Thus, an essentially copper-comprising interconnect will generally have a thickness less than an essentially aluminum-comprising interconnect due to copper's higher electrical conductivity.

Figure 6:
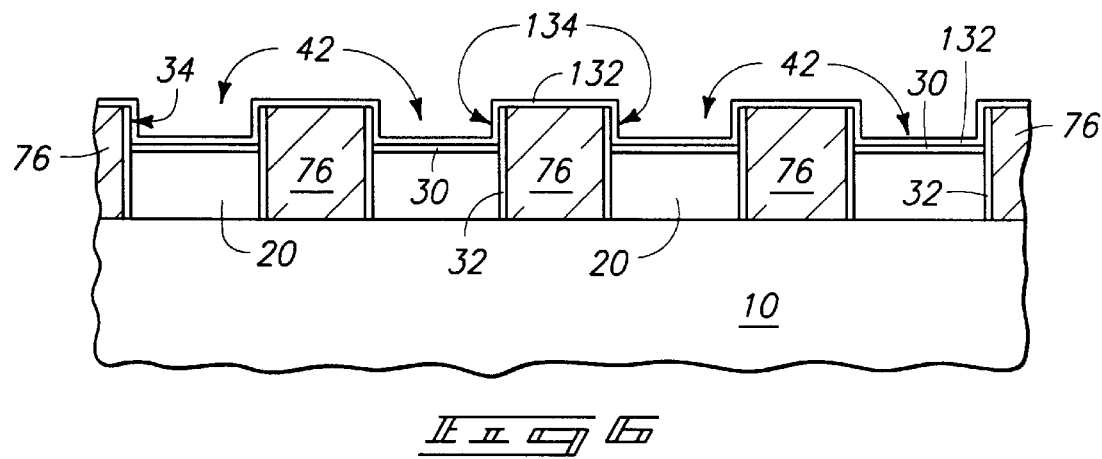

Turning now to FIG. 6, a second conformal barrier layer 132 is shown formed overlying first interconnects 76, barrier layer 30 and first conformal layer 32 after removal of first sacrificial material 40. Second barrier layer 132 has second sidewalls 134 which define a lateral dimension of first open regions 42 which result from removing such sacrificial material 40 therefrom. Second barrier layer 132 is formed from the same or similar materials and by using the same or similar methods as described above for first conformal barrier layer 32, and while generally is of the same thickness as employed for layer 32, another appropriate thickness can be selected. Removal of sacrificial material 40 to form first open regions 42 is generally accomplished using an etching method that is tailored to the specific materials employed for material 40 as well as barrier layer 30, if present. For example where material 40 encompasses silicon oxide and barrier layer 30 encompasses silicon nitride, a two part reactive ion etch (RIE) process will appropriately allow removal of both materials in a manner selective to first low-K material 20. Where barrier layer 30 is not present, the materials of first sacrificial layer 40 and first low-K layer 20 are chosen to be selectively etchable with respect to one another. In some embodiments where layer 30 is employed, as depicted, only the material of layer 40 is removed in the forming of first opening 42 and portions of barrier layer 30 remain. Thus, while FIG. 6 shows a structure having layer 30 overlying regions of low-K layer 20 and underlying second conformal layer 132, it will be noted that where layer 30 is removed, or not initially formed, second conformal layer 132 will be adjacent first low-K material 20.

Turning now to FIG. 7, the structure of FIG. 6 is depicted after a second dielectric stack 150 encompassing a low-K constant layer 120, a second barrier layer 130 and a second standard-K layer 140 are formed. As shown, second low-K material 120 fills first open regions 42 and extends elevationally above first interconnects 76. Typically, second low-K material layer 120 is formed to have a thickness that provides for such layer to extend above interconnects 76 by at least about 100 nm to about 600 nm, although other thickness can be employed. Second low-K material 120 can have the same composition as first low-K material 20 or can be a different low-K material. In one exemplary embodiment of the present invention, first low-K material layer 20 encompasses a carbon-comprising silicon oxide material and second low-K material 120 is a hydrogen silsesquioxane (HSQ) material. It will be noted that after forming second layer 120, such layer can be planarized prior to forming second barrier layer 130 and second standard-K material 140. However, where second low-K material 120 is formed using a spin-on type material and process, generally, such planarization is not needed to provide an essentially planar structure as depicted in FIG. 7. The forming of second materials 120, 130 and 140 is analogous to the forming of first materials 20, 30 and 40, although the thickness dielectric stack 150 is generally greater than that of first stack 50. For example, where first dielectric stack 50 is formed having a thickness of about 800 nm, second stack 150 will have a thickness of about 1200 nm. However, the materials and methods described for layers 20, 30 and 40 are generally applicable to the forming of second layers 120, 130 and 140 and will therefore not be described again. However, as mentioned for first barrier layer 30, the forming of second barrier layer 130 is optional.

FIG. 8 depicts the structure of FIG. 7 after forming a second masking layer 160, patterning such layer and forming second openings 154 and second dielectric blocks 152. The forming of second masking layer 160, second openings 154 and second blocks 152 is generally accomplished using the same or analogous materials and methods to that of first masking layer 60, openings 54 and blocks 52 (FIG. 2). Second barrier layer 132 is shown removed from over upper surface 74 of first interconnects 76. It will be noted that such is optional, and in some embodiments in accordance with the present invention, barrier layer 132 is not so removed. However, where such layer is removed, generally it is removed using the etching process employed for forming second opening 154.

In FIG. 9, second masking layer 160 is shown removed and a third conformal barrier layer 232 is shown formed overlying first interconnects 76 and second blocks 152 such that third surfaces 234 define a lateral dimension of second openings 154. Third barrier 232 generally being formed of the same or similar thickness and using the materials and methods as previously described for first conformal barrier 32.

Turning to FIG. 10, a second conductive layer 170 is shown filling openings 154 (FIG. 9) and extending elevationally above dielectric blocks 152. Such material is formed in the same or analogous manner to that of first layer 70. Thus, third conformal layer 232 is removed from over interconnects 76 within openings 154 to facilitate electrical contact thereto prior to forming layer 170, while portions of such conformal layer 232 are left disposed between layer 170 and dielectric blocks 152 to form a barrier therebetween. Generally, second conductive layer 170 is formed of a material similar or analogous to the material of first interconnects 76. Thus where interconnects 76 are of a copper-encompassing material, second layer 170 is also a copper-encompassing material. In some embodiments of the present invention, however, the materials of interconnects 76 and layer 170 are different, and where such different materials are selected, generally a conductive interface material (not shown) is employed therebetween. As depicted, second conductive layer 170 extends elevationally above dielectric blocks 152, hence the thickness of second conductive layer 170, as formed, is greater than the thickness of second dielectric blocks 152.

Referring now to FIG. 11, the structure depicted in FIG. 10 is shown at a subsequent processing step where second standard-K or sacrificial layer 140 is removed and second interconnects 176 are formed. It will be noted that in some embodiments, such forming of second interconnects 176 and removal of second sacrificial layer 140 is accomplished in a manner analogous to that of forming first interconnects 76 and removing first sacrificial layer 40. However, in some embodiments of the present invention, other methods are employed. For example, second conductive layer 170 can be etched using a commonly known plasma etching process to expose portions of second standard-K layer 140 and layer 140 then subsequently removed using second barrier 130 as an etch stop. Thus it will be understood that the specific method of forming the structure depicted in FIG. 11, nor that of other structures depicted in the other figures herein, is not intended to limit the scope and spirit of embodiments of the present invention.

Turning to FIG. 12, the structure of FIG. 11 is shown after forming third conformal layer 232 and third dielectric stack 250, such encompassing third low-K material layer 220, third barrier layer 230 and third standard-K or sacrificial layer 240. The forming of third conformal barrier layer 232 and third dielectric stack 250 is accomplished using methods and materials that are analogous to those employed for the forming of second conformal layer 132 and second dielectric stack 150 depicted in FIG. 7. Generally, however, while the thickness of third barrier 232 is similar to or the same as that of conformal barriers 32 and 132, the thickness of third dielectric stack 250 is generally the same as or greater than the thickness of second stack 150. Thus, for example, where second dielectric stack 150 is formed having a thickness of approximately 1200 nm, third stack 250 has a thickness of approximately 1200 nm to approximately 1600 nm.

Figure 13:
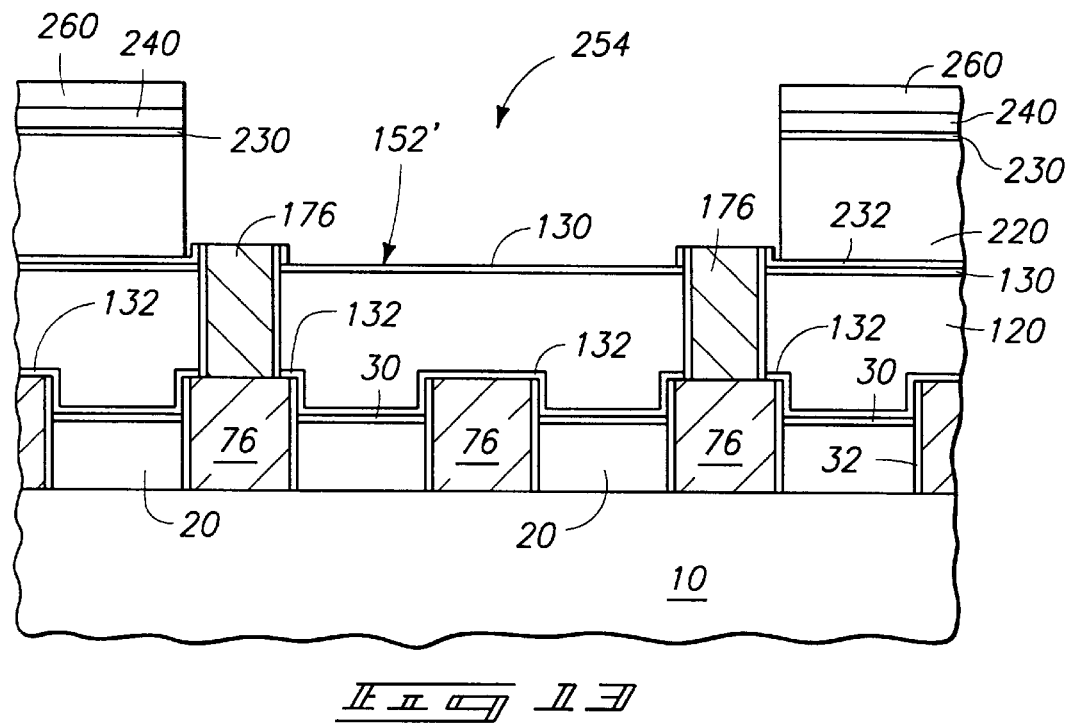
Figure 14:
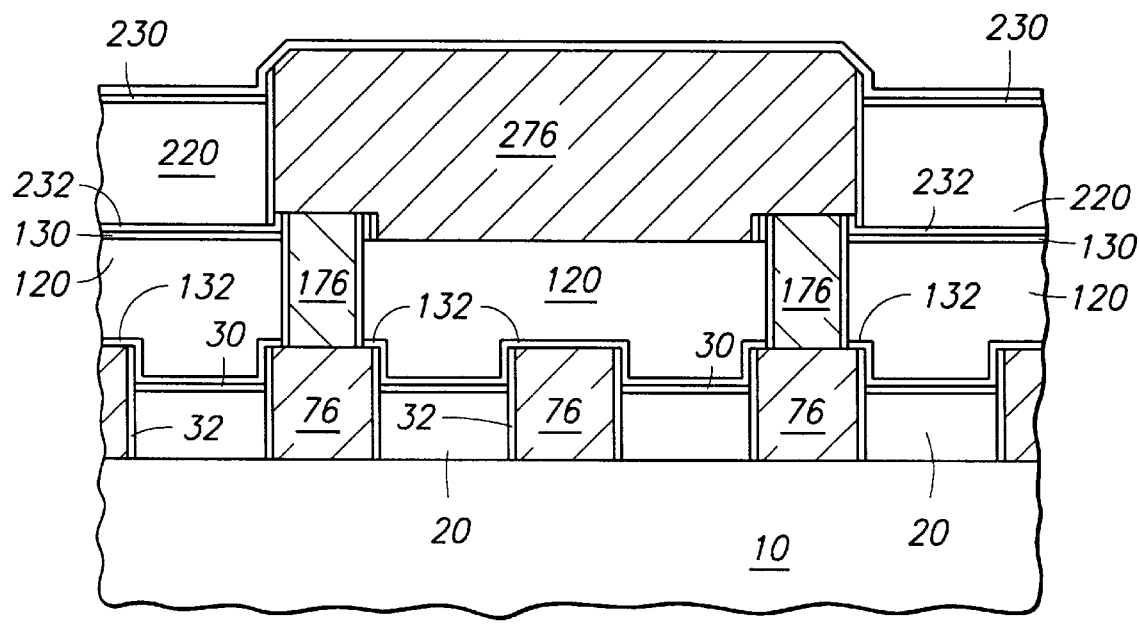

In FIG. 13, the structure of FIG. 12 is shown after forming a third masking layer 260, patterning such layer and forming third opening 254 and third dielectric blocks 252. The forming of third masking layer 260, third opening 254 and third dielectric blocks 252 is generally accomplished using the same or analogous materials and methods to that of first masking layer 60, openings 54 and blocks 52 (FIG. 2), respectively. However, as shown, and unlike the structure depicted in FIG. 8, third opening 254 encompasses not only second upper surfaces 174 of second interconnects 176, but also dielectric region 152' disposed therebetween. Thus, it will be understood that the process employed to remove portions of third low-K material 220, is selective to the material employed to form second barrier 130. That is to say that the material of layer 220 is removed preferentially with respect to the material of layer 130. In this manner opening 254 can be employed to form a conductive interconnect 276 between adjacent second interconnects 176 that provides for direct lateral interconnectivity as depicted in FIG. 14. It will be understood, that forming of interconnect 276 is provided in a manner the same as or analogus to the manner employed and described for the forming of second interconnect 176.

It will be understood, that embodiments of the present invention include, but are not limited to the exemplary structures depicted in the figures herein. Thus while such figures show the forming of three conductive interconnects 76, 176 and 276, embodiments in accordance with the present invention include integrated circuits having less than three such interconnects as well as embodiments having more than three such interconnects.

In addition, it will be understood that the capacitance between any two adjacent interconnects in an integrated circuit, for example such as between any two adjacent interconnects 76 as depicted in FIG. 7, is a function of the dielectric constant (K) of the material therebetween, the area of the electrodes and the distance between the electrodes.

Thus for the structure shown in FIG. 7, the capacitance will include contributions from barrier layer 30 (if present), conformal barrier layers 32 and 132 and portions of both low-K layers 20 and 120 that are disposed therebetween. Thus the following proportional relationship is known:

$$1/C_{Total}\ 1/C_{30} + 1/C_{32} + 1/C_{132} + 1/C_{20} + 1/C_{120}.$$

It can be seen, therefore, that where the lowest possible capacitance is desired, each of the various components should have as low a dielectric constant as possible for any given electrode area and any distance or spacing between the electrodes. In addition, where, for example, barrier layer 32 has a relatively high K, it is desirable for layer 32 to be as thin as possible to minimize its contribution. In a similar manner, where layer 20 and layer 120 are different materials, the thickness of the layer with the lowest K material should be maximized to provide for the maximum contribution of this low dielectric constant to the total capacitance.

As different materials, as has been discussed, having low dielectric constants have varying properties in addition to their respective dielectric constants, factors such as ease of use or application are also generally considered with regard to ensuring the most advantageous result. For example, in one embodiment in accordance with the present invention where ease of forming the low-K material layers is considered, low-K layer 20, applied in an early processing step (see, FIG. 1), is advantageously applied as a layer of a carbon-comprising silicon oxide material employing a CVD process. For layer 120, where spacing between interconnects 76 might inhibit filling the space between adjacent electrodes (see, FIG. 6), a liquid material having excellent fill characteristics such as an HSQ material is advantageously employed to facilitate the filling between interconnects 76 as well as enhance the planarity of the uppermost surface so formed. However, it will be noted that such exemplary selections of materials are illustrative only and other embodiments in accordance with the present invention are advantageously formed of other materials and by other methods.

It should also be realized that forming of the low-K dielectric materials between adjacent interconnects in accordance with embodiments of the present invention offer several advantages over previously known methods. For example, where a, relatively thick interconnect is needed (for example interconnects 76, 176 or 276), forming a low-K layer from a single material in a single application can often be problematic. Thus low-K materials applied from a liquid spin-on source, while often offering the lowest dielectric constant are generally not as thermally or physically stable as standard-K dielectric materials such as those formed from a CVD type of process. Thus it is often difficult to apply relatively thick layers of these low-K materials without significant outgassing, layer cracking or dimensional instability problems occurring during curing and subsequent processing. CVD films encompassing fluorine, while more stable than such spin-on materials, generally only have a dielectric constant of about 3.4. In addition, such layers are known to lose fluorine during subsequent processing resulting in contamination problems. Carbon-comprising silicon oxide materials also do not generally have a very low dielectric constant and while typically formed using a CVD method, such films are often prone to particle contamination where thick films are formed. Finally, newer carbon containing films such as proprietary carbon, nitrogen, hydrogen films (U.S. Pat. No. 5,946,601); or BLOK™, the proprietary amorphous film composed of silicon, carbon and hydrogen, produced by Applied Materials' of Santa Clara, Calif., seem more applicable to the instant invention as barrier materials for their reportedly superior diffusion barrier properties.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for reducing line-to-line capacitance, comprising:
    forming a low dielectric constant (K) material on a surface of a semiconductive material comprised by a semiconductor substrate;
    forming a standard-K material over the low-K material;
    forming an opening through the low-K material and through the standard-K material, the forming the opening exposing the semiconductive material at a base of the opening;
    forming a conductive material proximate the low-K material and the standard-K material; and
    forming a barrier layer disposed between the low-K material and the conductive material before forming the conductive material.

2. The method of claim 1 wherein forming the low-K material comprises forming the low-K material from a material selected from the group consisting of a hydrogen silsesquioxane, a methyl silsesquioxane, a polyarylene ether, a fluorine-comprising silicon oxide and a carbon-comprising silicon oxide.

3. The method of claim 1 wherein forming the low-K material comprises forming the low-K material from a spin-on low-K precursor material.

4. The method of claim 1 wherein forming the low-K material comprises forming the low-K material employing a chemical vapor deposition process.

5. The method of claim 1 wherein forming the standard-K material comprises forming a layer of a silicon oxide material.

6. The method of claim 5 wherein forming the layer of silicon oxide material comprises forming the silicon oxide material employing a chemical vapor deposition process.

7. The method of claim 1 wherein forming the conductive material proximate the low-K material and the standard-K material comprises forming the conductive material from a copper-comprising material.

8. The method of claim 1 wherein forming the conductive material proximate the low-K material and the standard-K material comprises forming the conductive material from an aluminum-comprising material.

9. The method of claim 1 wherein forming the barrier layer comprises forming a diffusion barrier comprising nitrogen.

10. The method of claim 9 wherein forming the diffusion barrier comprising nitrogen comprises forming the diffusion barrier of a material selected from the group consisting of a silicon nitride material, a silicon oxynitride material, a refractory metal nitride material, a hydrogen and nitrogen-comprising amorphous carbon material and a silicon and nitrogen-comprising amorphous carbon material.

11. The method of claim 1 wherein forming the opening comprises etching the low-K material and the standard-K material and wherein the forming the conductive material proximate the low-K material and the standard-K material comprises forming the conductive material such that the opening is essentially completely filled with the conductive material.

12. The method of claim 11 wherein the opening is a first opening; wherein the etching comprises etching the low-K material and the standard-K material to form a plurality of openings such that the plurality of openings define a plurality of spaced apart dielectric-comprising blocks; and wherein forming the conductive material comprises essentially filling each of the plurality of openings with the conductive material such that a plurality of interconnects is formed, each interconnect separated from another by a spaced apart dielectric block.

13. The method of claim 1, further comprising:
    patterning the low-K material and the standard-K material to form spaced blocks over the substrate;
    forming a conductive material over and between the spaced blocks;
    planarizing the conductive material to expose the standard-K material of the spaced blocks and to form an array of conductive interconnects, between the spaced blocks;
    removing the exposed standard-K material from over the low-K material of the spaced blocks; and
    forming a second layer of low-K material over the conductive material and the low-K material of the spaced blocks.

14. The method of claim 13 further comprising forming a conformal barrier layer over the spaced blocks before forming the conductive material over and between the spaced blocks such that after forming the conductive material a portion of the conformal barrier layer is disposed between the spaced blocks and the conductive material.

15. The method of claim 14 further comprising removing portions of the conformal barrier layer overlying an upper surface of the standard K material prior to forming the conductive material.

16. A semiconductive processing method, comprising:
    forming a low dielectric constant (K) material on a surface of a semiconductive material comprised by a semiconductor substrate;
    forming a sacrificial material over the low-K material, the sacrificial material not being a low-K material;
    forming an opening through the low-K material and through the sacrificial material, the forming the opening exposing the-semiconductive material at a base of the opening;
    forming a conductive material over and adjacent the sacrificial material; and
    removing the conductive material and sacrificial material from over the low-K material.

17. The method of claim 16 wherein forming the low-K material comprises forming the low-K material from a liquid low-K precursor material.

18. The method of claim 16 wherein removing the conductive material comprises removing the material employing a chemical mechanical polishing process.

19. The method of claim 16 wherein removing the sacrificial material comprises removing the material employing a plasma etching process.

20. The method of claim 16 further comprising forming a second low-K material over the low-K material disposed over the substrate and the metal layer, after removing the sacrificial material.

21. The method of claim 20 wherein forming the second low-K material comprises forming the second material from a material selected from the group consisting of a hydrogen silsesquioxane, a methyl silsesquioxane, a polyarylene ether, a fluorine-comprising silicon oxide and a carbon-comprising silicon oxide after forming a conformal barrier layer over the metal layer, the conformal barrier layer selected form the group consisting of a silicon nitride material, a silicon oxynitride material, a refractory metal nitride material, a hydrogen and nitrogen-comprising amorphous carbon material and a silicon and nitrogen-comprising amorphous carbon material.

22. A semiconductor processing method, comprising:

forming a low-K dielectric material over a surface of a semiconductive material comprised by a substrate;

forming a second material over the low-K dielectric material;

patterning the low-K dielectric material and second material to form spaced apart blocks over the substrate, the patterning exposing the semiconductive material between the spaced apart blocks; and forming a conductive material over and between the spaced apart blocks.

23. The method of claim 22 further comprising forming a conformal barrier layer over the spaced apart blocks prior to forming the conductive material.

24. The method of claim 23 further comprising removing the conductive material from over the spaced apart blocks to form a plurality of conductive interconnects.

25. The method of claim 24 wherein removing the conductive material comprises removing the material employing a chemical mechanical polishing process.

26. The method of claim 23 wherein forming the conductive material comprises forming a copper comprising material or an aluminum comprising material.

* * * * *

UNITED STATES PATENT AND TRADEMARK OFFICE
CERTIFICATE OF CORRECTION

PATENT NO. : 6,531,407 B1
DATED : March 11, 2003
INVENTOR(S) : Huang et al.

It is certified that error appears in the above-identified patent and that said Letters Patent is hereby corrected as shown below:

Title page,
Item [57], ABSTRACT,
Line 12, replace "and-second" with -- and second --.
Line 19, replace "there between" with -- therebetween --.

Column 2,
Line 33, replace "Interconnects" with -- interconnects --.

Column 4,
Line 3, replace "(CVI))" with -- (CVD) --.
Line 8, replace "(rm)" with -- (nm) --.
Line 19, replace "in." with -- in --.
Line 31, replace "nitride, silicon" with -- nitride, a silicon --.

Column 7,
Line 18, replace "800 mn" with -- 800 nm --.

Column 9,
Line 42, replace "152'" with -- 152 --.

Column 10,
Line 7, replace "$1/C_{Total}1/C_{30}+1/C_{32}+1/C_{132}+1/C_{20}+1/C_{120}.$" with
-- $1/C_{Total} \propto 1/C_{30}+1/C_{32}+1/C_{132}+1/C_{20}+1/C_{120}.$ --.
Line 44, replace "a," with -- a --.

Column 12,
Line 48, replace "the-semiconductive" with -- the semiconductive --.

UNITED STATES PATENT AND TRADEMARK OFFICE
CERTIFICATE OF CORRECTION

PATENT NO. : 6,531,407 B1
DATED : March 11, 2003
INVENTOR(S) : Huang et al.

It is certified that error appears in the above-identified patent and that said Letters Patent is hereby corrected as shown below:

Column 13,
Line 7, replace "form" with -- from --.

Signed and Sealed this

Nineteenth Day of August, 2003

JAMES E. ROGAN
*Director of the United States Patent and Trademark Office*